(12) United States Patent (10) Patent No.: US 8,180,623 B2
Lendermann et al. (45) Date of Patent: May 15, 2012

(54) INTEGRATION OF A DISCRETE EVENT SIMULATION WITH A CONFIGURABLE SOFTWARE APPLICATION

(75) Inventors: Peter Lendermann, Singapore (SG); Nirupam Julka, Singapore (SG); Lai Peng Chan, Singapore (SG); Boon Ping Gan, Singapore (SG)

(73) Assignee: Agency for Science, Technology And Research, Singapore (SG)

( * ) Notice: Subject to any disclaimer, the term of this patent is extended or adjusted under 35 U.S.C. 154(b) by 588 days.

(21) Appl. No.: 12/034,091

(22) Filed: Feb. 20, 2008

(65) Prior Publication Data

US 2008/0154570 A1 Jun. 26, 2008

Related U.S. Application Data

(63) Continuation of application No. 10/301,788, filed on Nov. 22, 2002, now abandoned.

(51) Int. Cl.
*G06F 9/45* (2006.01)
(52) U.S. Cl. .......................................... 703/22
(58) Field of Classification Search .................. 703/22
See application file for complete search history.

(56) References Cited

U.S. PATENT DOCUMENTS

| | | | |
|---|---|---|---|
| 5,544,348 A | | 8/1996 | Umeda et al. |
| 5,701,439 A | * | 12/1997 | James et al. ............ 703/17 |
| 5,794,005 A | | 8/1998 | Steinman |
| 5,999,724 A | | 12/1999 | Iwasa et al. |
| 6,134,514 A | | 10/2000 | Liu et al. |
| 6,256,676 B1 | | 7/2001 | Taylor et al. |
| 6,278,963 B1 | | 8/2001 | Cohen |
| 6,425,762 B1 | | 7/2002 | Ernst |
| 6,628,287 B1 | | 9/2003 | Duda et al. |
| 2001/0034628 A1 | | 10/2001 | Eder |
| 2002/0026630 A1 | | 2/2002 | Schmidt et al. |

OTHER PUBLICATIONS

Au "Performance Issues of HLA Run Time Infrastructure based on CORBA", Sim Tech 2000.*
Seliger et al. "On the HLA-and Internet-Based Coupling of Commercial Simulation Tools for Production Networks", 1999.*
Milind M. Datar, "Enterprise Simulation: Framework for a Strategic Application", Proceedings of the 2000 Winter Simulation Conference, J.A. Joines, R.R. Barton, K. Kang and P.A. Fishwick, eds., pp. 2010-2014.

(Continued)

*Primary Examiner* — Saif Alhija
(74) *Attorney, Agent, or Firm* — Sughrue Mion, PLLC

(57) ABSTRACT

In general terms, the invention can be described as a computer system for enhancing the performance of underlying policies and execution-rules of real-world activities. The computer system includes a demand input section for providing demand information to drive the system. A real-time software application has a series of discrete steps for implementing the underlying policies and execution-rules of the activities and converts the demand information into instructions. A simulation-time operations-simulation model implements the underlying policies and execution-rules of the activities and receives the instructions. A control section includes a synchronization clock which synchronizes the discrete steps of the software application with the operations-simulation model by delaying the execution of some of the discrete steps and which communicates the instructions from the software application to the operations-simulation model. An output section outputs data to enhance the performance of the underlying policies and the execution-rules of the activities.

22 Claims, 14 Drawing Sheets

OTHER PUBLICATIONS

Michael W. Barnett and Charles J. Miller, "Analysis of the Virtual Enterprise Using Distributed Supply Chain Modeling and Simulation: An Application of e-scor", Proceedings of the 2000 Winter Simulation Conference, J.A. Joines, R.R. Barton, K. Kang, and P.A. Fishwick, eds., pp. 352-355.

On the HLA and Internet Based Coupling of Commercial Simulation Tools for Production Networks, Seliger et al. 1999.

"Integrating Discrete Event Simulation Into Manufacturing System Development: A Methodological Approach." Hoist. Mar. 2001.

Au, "Performance Issues of HLA Run Time Infrastructure based on CORBA", Sim Tech 2000.

* cited by examiner

INTEGRATION OF A DISCRETE EVENT SIMULATION WITH A CONFIGURABLE SOFTWARE APPLICATION

This is a continuation of application Ser. No. 10/301,788 filed Nov. 22, 2002 now abandoned. The entire disclosure of the prior application, application Ser. No. 10/301,788 is hereby incorporated by reference.

FIELD OF THE INVENTION

The present invention relates to a method and apparatus for modeling, simulating, and enhancing planning and operations. In particular the invention relates to the integration of discrete event simulation with a framework-based software application for enhancing the performance of underlying policies and execution-rules.

BACKGROUND OF THE INVENTION

Enterprise Resource Planning (ERP) packages are business management systems that integrate all facets of a business, including planning, manufacturing, sales, and marketing. One of the major shortcomings of traditional ERP packages is that they are very inflexible and unable to handle very complex business processes. Such business applications are initially created using specific business model templates. These templates are customized by manually changing settings and parameters in the software package. Changes in the business processes are always constrained by such templates in these packages.

These shortcomings are addressed by a so-called "framework-based" business application technology. The underlying principle of the framework is to create a meta-model of the business processes and then use this model to directly generate the application. The meta-model is created using very simple elements. Subsequent changes of any kind can then be made without any constraints imposed by any template because the new application is not just a variation of the old application with changed settings and parameters but it is generated directly from the updated meta-model and actually replaces the old application. A framework-based implementation allows easy configuration of application components to create dynamic applications. This allows dramatic reduction of the overall time for the creation of a business application from a business model and reduction of the effort for reconfiguration of the application every time the business model changes.

The available commercial technologies, based on the "framework-based" technique, use a combination of object-oriented and software agent technology. The various business documents and the operations that can be performed over these documents are modeled as objects. The meta-model is prepared by using these documents and operations objects and linking them together using a visual interface. The business application is generated by the creation of software agents, which execute the operations over the documents. The connections between different agents are created based on the processes defined in the meta-model. This agent framework is essentially the backend of the application.

Discrete event simulation concerns the modeling of an operational system as it evolves over time by a computer representation in which state variables change instantaneously at discrete points in time at which events occur. An event is defined as an instantaneous occurrence that may change the state of the system. In this way an artificial history of the system can be generated by operation of a computer model of the system. This kind of rapid experience acquisition is normally infeasible with the real system because experimentation with real system is often disruptive, seldom cost-effective and sometimes impossible. The capability of discrete event simulation to portray random effects and the dynamic behavior of an operational system makes it a very powerful technology for operational performance analysis.

The High Level Architecture (HLA) is a general-purpose architecture for simulation reuse and interoperability. The HLA was developed under the leadership of the Defense Modeling and Simulation Office (DMSO) to support reuse and interoperability across the large numbers of different types of simulations developed and maintained by the Department of Defense. The Object Management Group (OMG) adopted the HLA as the Facility for Distributed Simulation Systems 1.0 in November 1998. The HLA was approved as an open standard through the Institute of Electrical and Electronic Engineers (IEEE)—IEEE Standard 1516—in September 2000. The HLA MOA was signed and approved in November 2000. The HLA-compliant simulation, termed as a federation, is a collection of simulation models, termed as federates.

In today's business environment "change" has emerged as the only constant. The speed, cost and efficiency at which these changes are executed has become an important competitive advantage for a corporation. However, improvements in operations and business are often discarded at the design table today as their implementation involves too much work and the advantage is lost by the time the changes are made. Further, the effects of business changes on operations and vice-versa are investigated by either employing external consultants or by assigning internal resources but seldom involve validation of the findings through techniques like simulation.

Framework-based business application software systems have reduced the implementation time and the effort that is needed to reconfigure the enterprise application to incorporate alternative policies and changes in the highly complex business processes of organizations.

Within prior art framework-based implementations of business applications, simulations have been used to increase the efficiency of the application and test for system integrity as illustrated in FIG. 1 (Prior Art). The business processes themselves are deterministic in nature.

Programs that emulate the real situation with some probability distribution (i.e. simulation models) and data files having scenario-specific data to emulate the databases introduce randomness in a scenario. In the example of FIG. 1, the programs are Java programs which emulate the externals (e.g. a customer coming onto a web site and placing an order). Also in the example of FIG. 1, the data files are "XML scenario files". They represent a particular state of the corporation and can be used to define scenarios. They emulate the databases of the corporation. The scenarios are a set of chosen policies with a particular configuration of the system. They define a situation corresponding to a real life situation that could occur. The scenarios include a sequence of events following a certain configuration and initialization of the system. As an example of a particular scenario, one could choose to have all the machines in an operations model super loaded with orders and then add more orders. First there is a warm-up in which orders are fed into the system to fill the queues.

Statistics collected are for an individual agent and for each scenario. Statistics collected over multiple replications are used for analysis. Here, running a simulation of the same scenario a number of times is called replicating the simulation. The statistics include the various different values associated with the particular scenario study. For example, the statistics can describe the number of transactions between the database and the system, the load (transactions) per agent in the system, etc. These values, or statistics, are indicative of the performance of the system in relation to various scenarios. The agent here is represented as a piece of software with an objective, process for achieving the objective and set of resources to use to reach the objective. In the present case, the agents run the system and execute the various business processes. However, this kind of simulation—which is not discrete event simulation (DES)—is not sufficiently able to provide direct and obvious information on the impact of changes in the business model upon the operational and business performance.

On the other hand, with conventional (discrete event) simulation approaches it is possible to analyze different business scenarios and to optimize the underlying models based on the results. But implementation/realization of these changes in the corresponding business applications remains cumbersome and in some cases impossible.

Also, today's business models are driven by customer demand (push), whereas conventional simulation models are input-release driven and represent only the operational execution. Input release, however, is the result of a complex translation from customer demand into material quantities to be released into and moved within the system at pre-specified times. Consequently, in a demand-driven business world, simulation models can be made much more realistic if the process of translating demand into input release (i.e. planning and order management) and the complex interdependencies between the business processes and the operational execution are incorporated in it.

In summary, some of the shortcomings when applying framework-based business applications or discrete event simulation systems individually are:

1) Even with advanced framework-based applications the performance of business operations can only be addressed based on the real history of the system. Here the real history of the system is when a real event has occurred and been reported (e.g. the production profile of a month once the month is over).

2) Operational models that are optimized using conventional discrete event simulation technology are difficult to implement.

3) The scope of traditional simulation models does not sufficiently take into account the fact that the underlying business is typically customer-demand driven rather than input-release driven.

SUMMARY OF THE INVENTION

The present invention allows framework-based applications to perform discrete event simulations and to combine these applications with discrete event simulation model components. In this way it is possible to "kill two birds with one stone", i.e., to address the shortcomings when applying framework-based business applications or discrete event simulation systems individually.

Simulation models and business application software are both representations of the actual operations of an enterprise. The present invention is a unified, and optionally distributed, simulation and implementation technology where the entire performance process can be represented along a supply chain in a unified business model. It improves the performance of business operations with discrete event simulation technology, and then generates and implements the corresponding business application software from the same unified business model, based on a framework-based implementation technology which, unlike conventional applications such as ERP systems, allows the adaptation of operations to permanently changing business environments with the required flexibility and minimal human effort. This allows a company to optimize both operational and business processes through simulation of the entire performance process along the value-added chain (including planning and customer order management) rather than just the manufacturing process. By using framework-based business application software, optimized business rules/policies can then be implemented into real life systems with minimal effort and time.

In general terms, the invention can be described as a computer system for enhancing the performance of underlying policies and execution-rules of real-world activities. The computer system includes a demand input section for providing demand information to drive the system. A real-time software application has a series of discrete steps for implementing the underlying policies and execution-rules of the activities and converts the demand information into instructions. A simulation-time operations-simulation model implements the underlying policies and execution-rules of the activities and receives the instructions. A control section includes a synchronization clock which synchronizes the discrete steps of the software application with the operations-simulation model by delaying the execution of some of the discrete steps and which communicates the instructions from the software application to the operations-simulation model. An output section outputs data to enhance the performance of the underlying policies and the execution-rules of the activities.

BRIEF DESCRIPTION OF THE FIGURES

Further preferred features of the invention will now be described for the sake of example only with reference to the following Figures, in which:

FIG. 12 (b) demonstrates synchronizing applications that advance in time through state changes utilizing a federate agent which changes the state of an object O,' which is a clone of object O, based on the synchronization with externals.

DETAILED DESCRIPTION OF THE EMBODIMENTS

Figure 1:
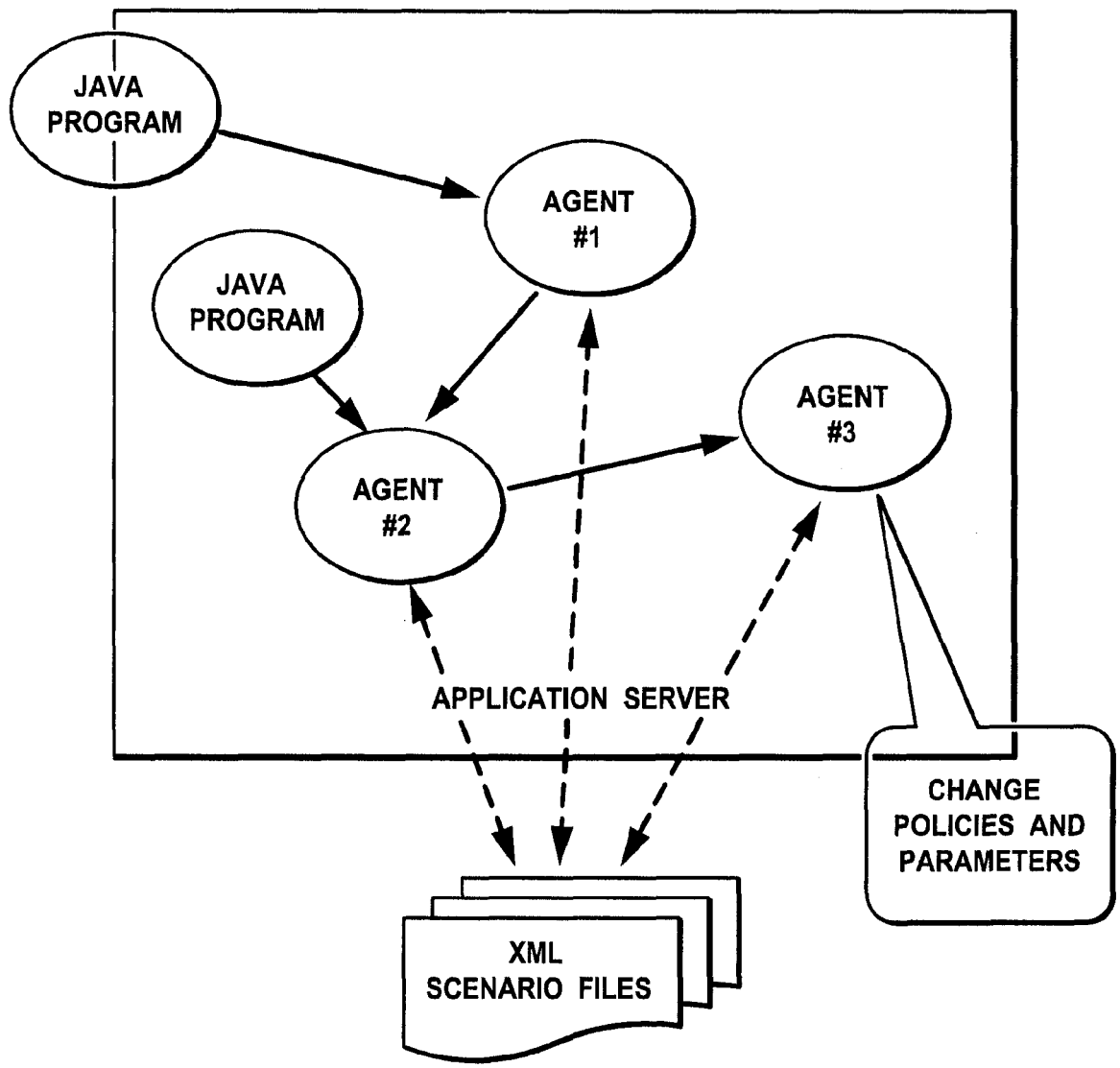
FIG. 1 illustrates a simulation in a framework-based implementation of the prior art.
Figure 2:
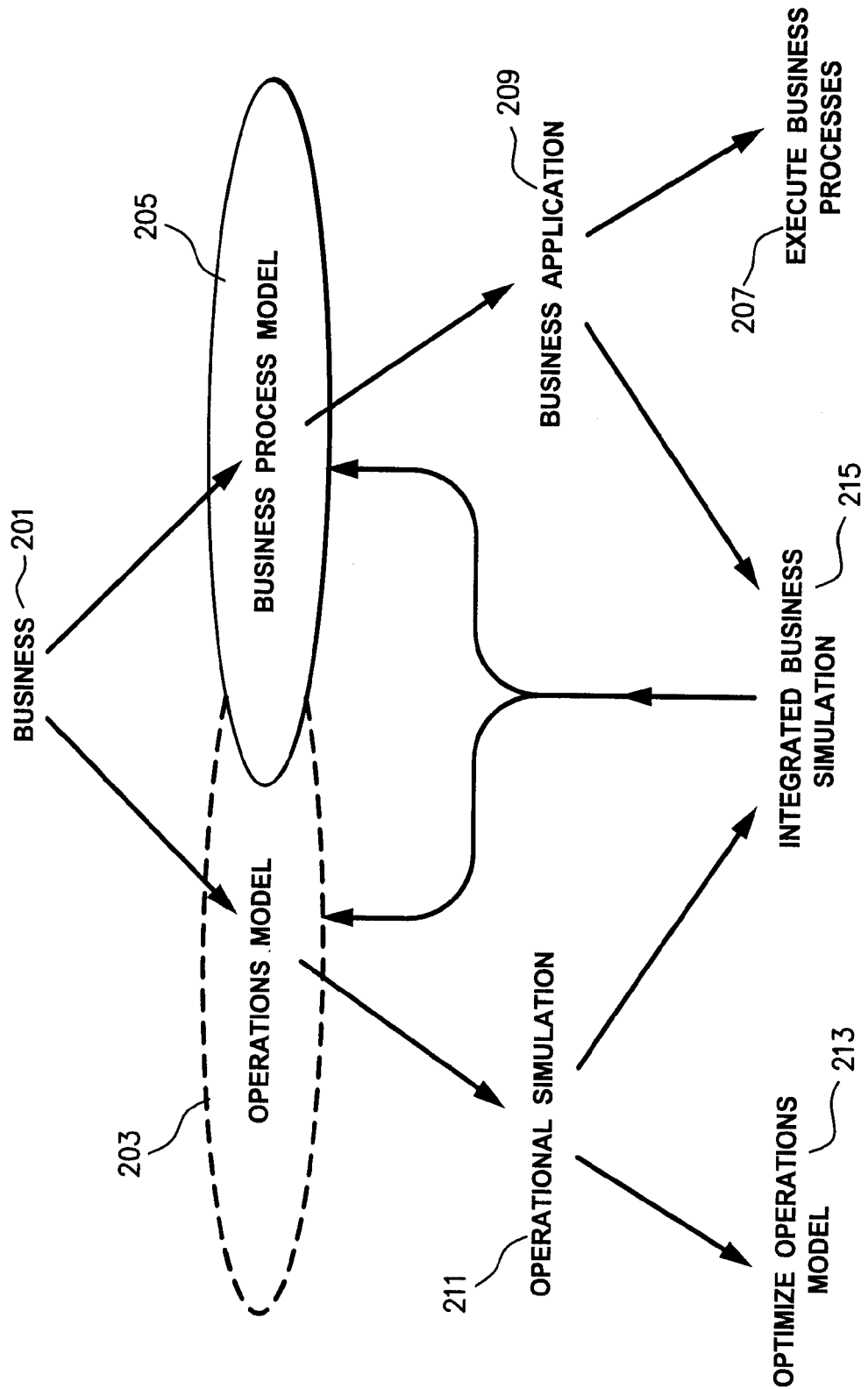
FIG. 2 illustrates a general implementation of the invention.

FIG. 2 shows a general implementation of the invention. The business 201 of the enterprise includes an operations model 203 and a business process model 205. The business or software application 209 is created using a framework-based implementation. This application is usually an abstraction of the business process model 205. On the other hand, the operational simulation 211 is the abstraction of the operations model 203. The operational simulation 211 is used to optimize the operations model 213. The present invention uses the operational simulation 211 with the framework-based business application 209 to perform an integrated business simulation 215. This allows for improvements to be made over both the business and the operations model at the same time.

Figure 3:
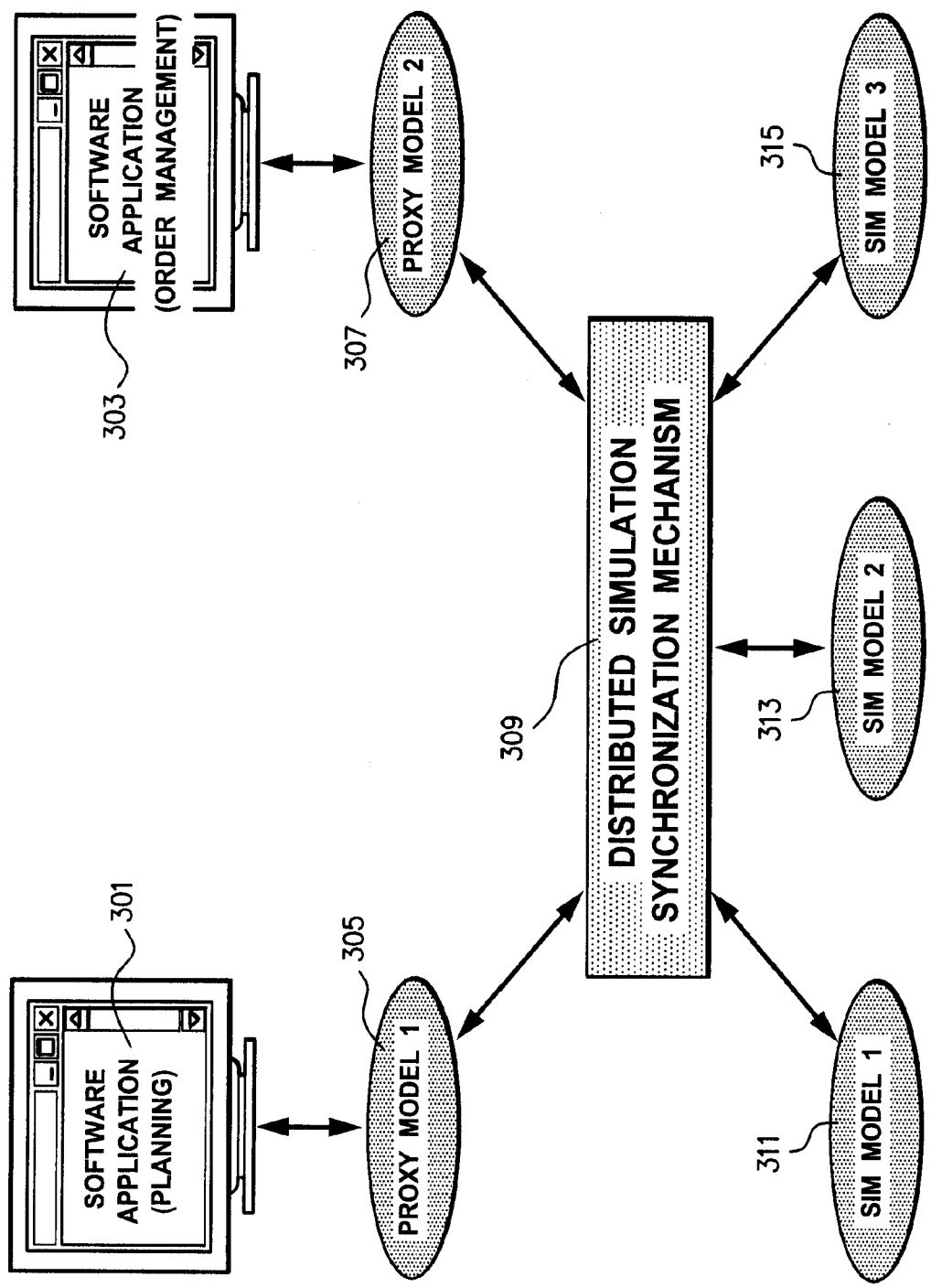
FIG. 3 represents the overall architecture of the system including the synchronization of the software applications with the simulation models through a distributed simulation synchronization mechanism utilizing proxy models.

FIG. 3 represents the overall architecture of the system. The software application 209 of FIG. 2 may be lumped as one or divided into separate software applications such as a planning software application 301 and a order management software application 303 as illustrated in FIG. 3. The software applications 301 and 303 can be serviced by different proxy models, 305 and 307, respectively, or if a single software application 209 is used, then a single proxy model can be used. The software applications 301 and 303 are synchronized with simulation models 311, 313 and 315 through proxy models 305 and 307 and through a distributed simulation synchronization mechanism 309. The simulated synchronization mechanism 309 can be the HLA-RTI software implementation of the High Level Architecture (HLA). In an overall business and operations evaluation, the software applications 301 and 303 are generally used to represent systems performing automated operations in FIG. 9. The simulation models 311, 313 and 315, on the other hand, generally represent steps which are executed by humans and production machines.

Figure 4:
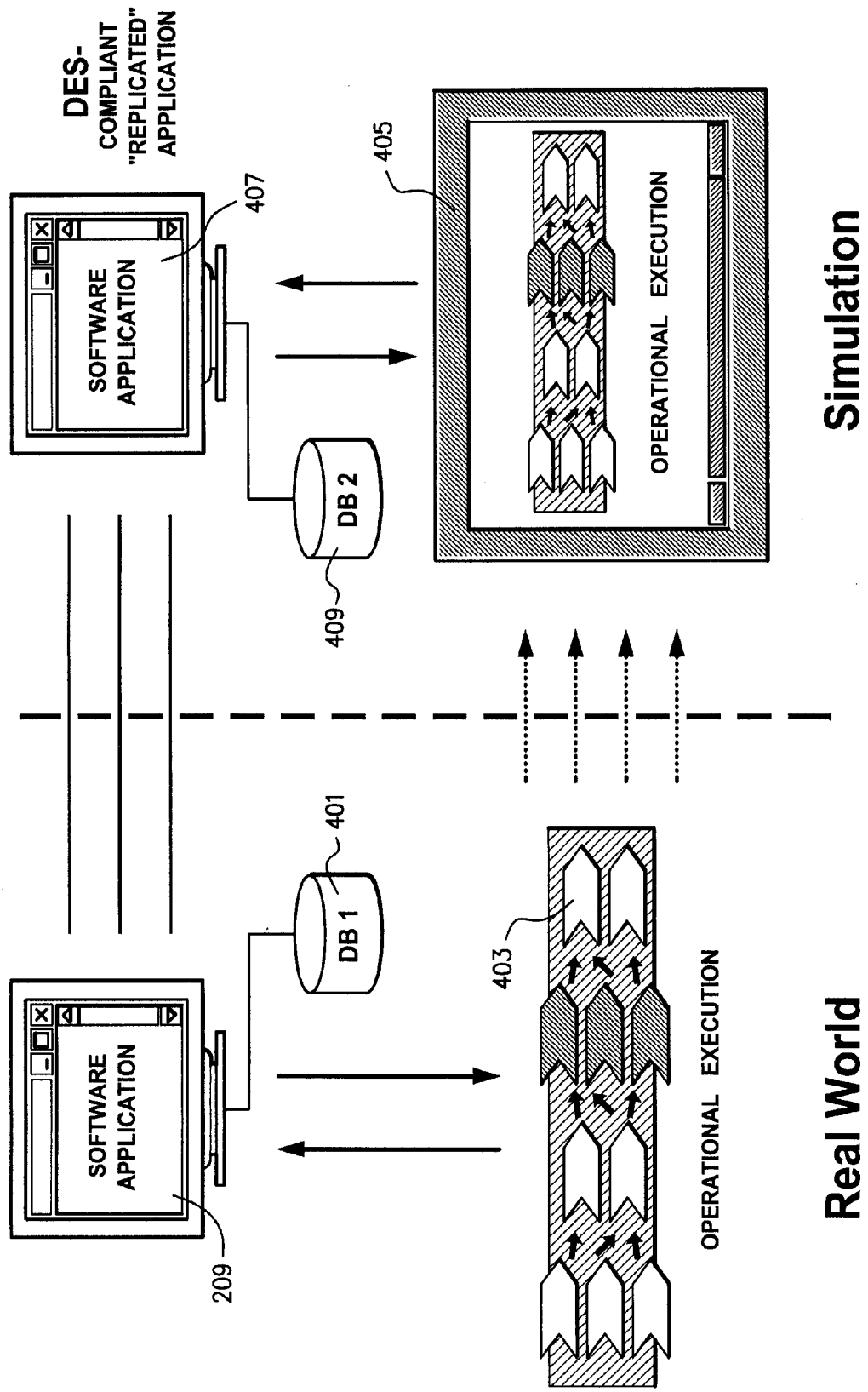
FIGS. 4-7 show the process for simulating a software application together with operations models of real world activities in order to enhance the performance of underlying policies and execution-rules.

FIGS. 4-7 describe how a DES-compliant business application is improved using simulation and how the transition between an old business application and a new business application is carried out. In FIG. 4 the "real world" software application 209 and a connected "real world" database 401 are shown. The software application 209 runs the business and interacts with the operational execution 404 to plan and manage operations. The databases store all information regarding the transactions being carried out by the application, the state of all the orders, etc. The application then operates on the information in the database. An operational execution simulation model 405 is created providing a DES simulation of the "real world" operational execution 403. A software application 407 is also created which is a DES-compliant substantially-exact replica of the software application 209. Additionally, a connected database 409 is created which is a duplicate of the database 401. The DES-compliant software application 407 interacts with the operation execution simulation model 405 using data from the database 409 for simulation in a distributed environment.

Figure 5:
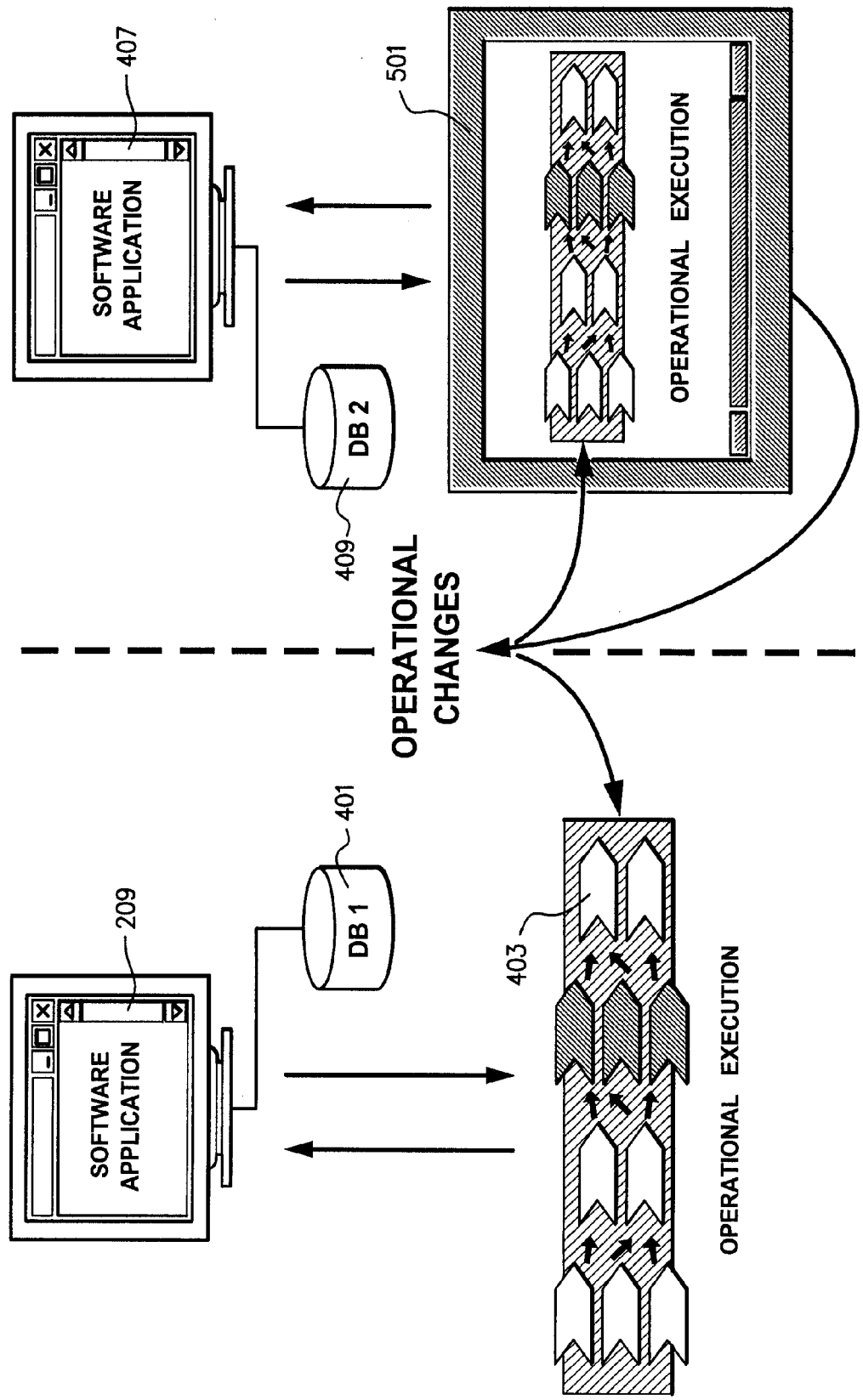
Figure 6:
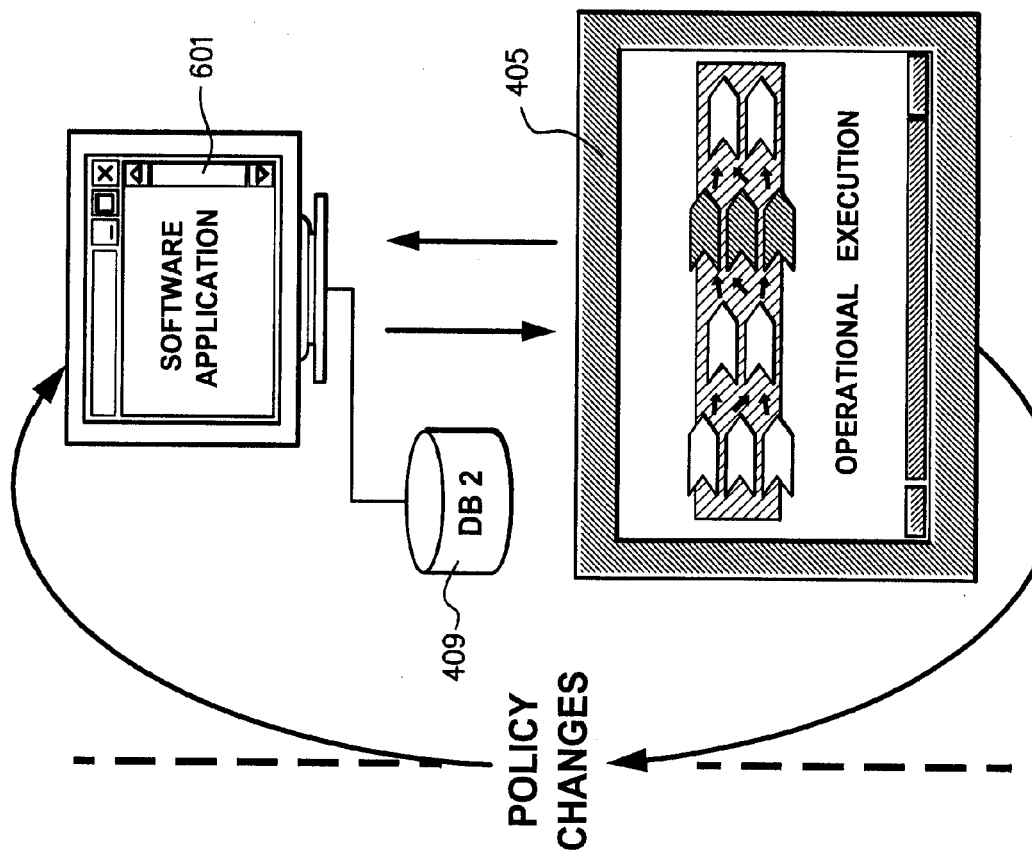
Figure 6:
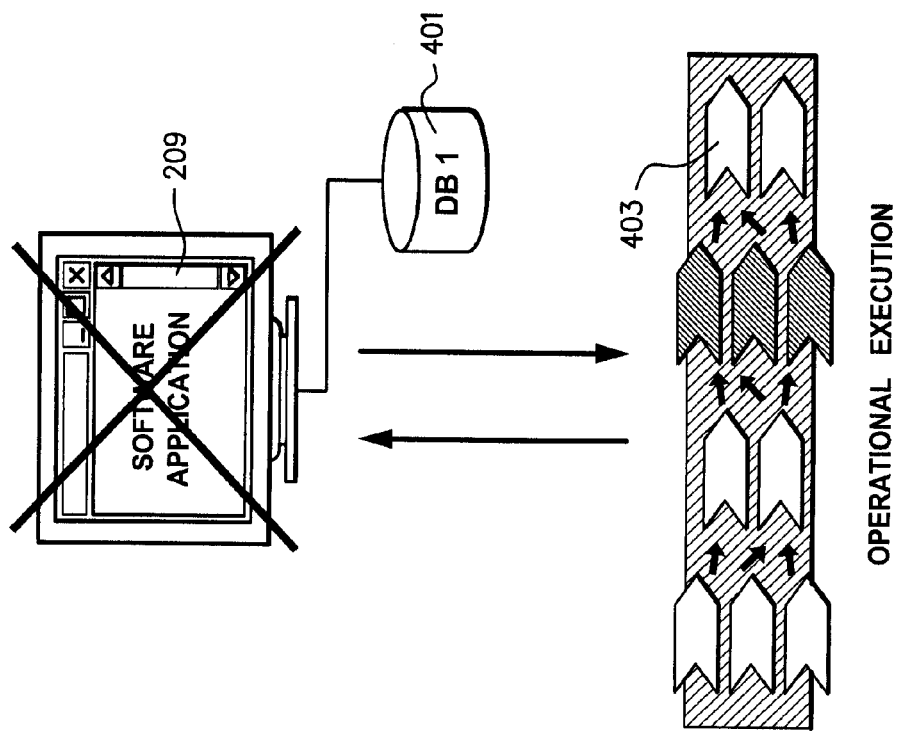
Figure 7:
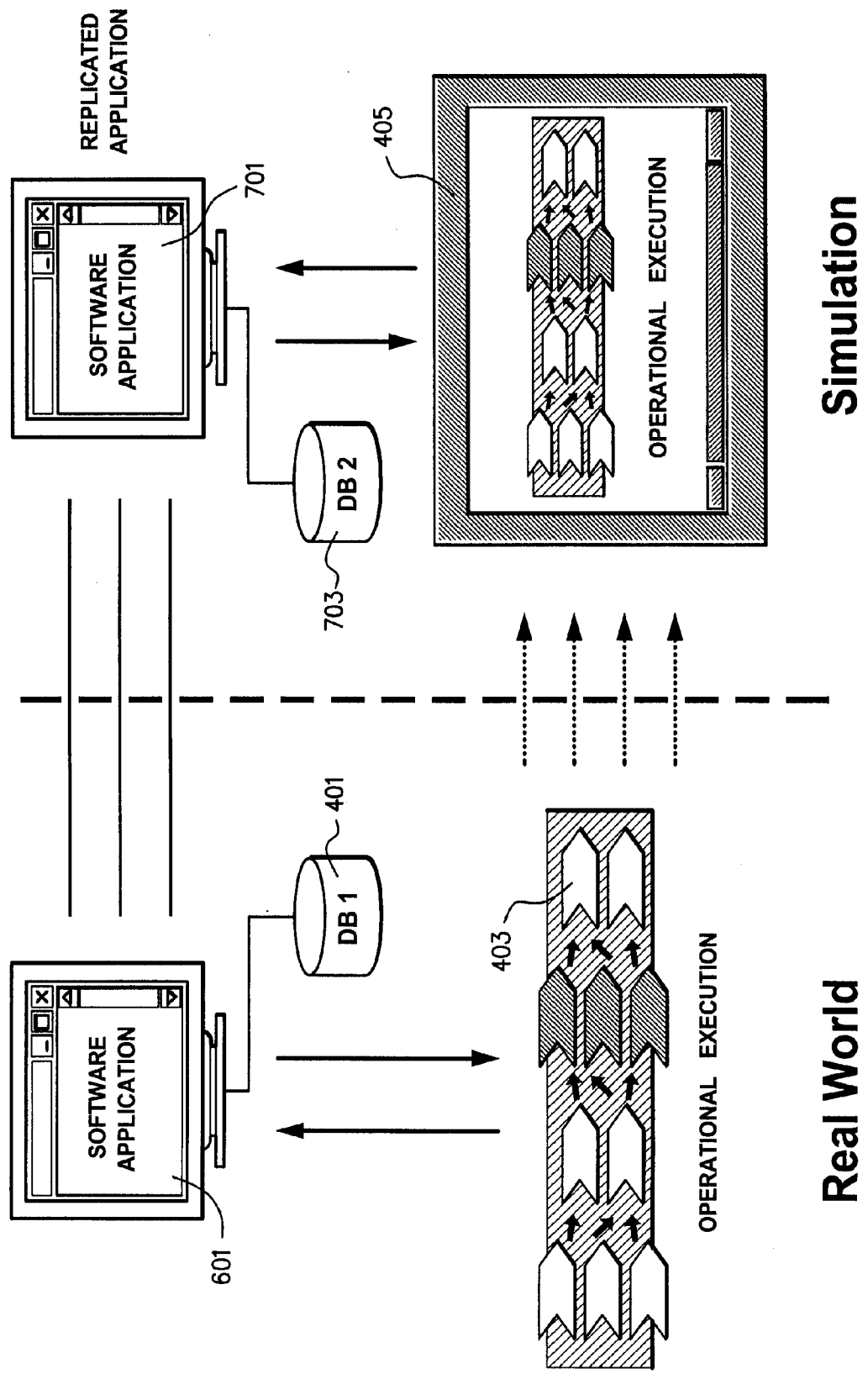

Based on the output of the operational execution simulation model 405, operational changes are suggested for the operational execution simulation model 309 as well as the actual "real world" operational execution 403, as illustrated in FIG. 5. An updated operation execution simulation model 501 is generated in place of the model 405. Also, based on the output of the operational execution simulation model 405, policy changes are suggested and a new DES-compatible software application 601 is generated or, in other words, the DES-compatible software application 407 is updated using the framework metamodel as illustrated in FIG. 6. At the point where the DES-compatible software application 601 seems to be the better application to work with, the application 209 is discarded, as illustrated by the "X" in FIG. 6. The updated software application 601 can then replace the disguarded application 209. The original database 401 is used to upload the information of the various active objects into the updated software application 601. A new DES-compatible software application 701, a substantial copy of 601, is generated along with a database 703 (a snapshot of the database 401). The application 701 and the database 703 are then used for simulation purposes resulting in the application 701 being updated.

In improving the business application through simulation as described with respect to FIGS. 4-7 above, all the relevant manufacturing, logistics and decision-making events, as far as they are not triggered by the business application itself, are emulated. The simulation of FIGS. 4-7 also configures various scenarios on the fly and performs multiple simulations to analyze the performance of the business operations and changes made in it.

Figure 8:
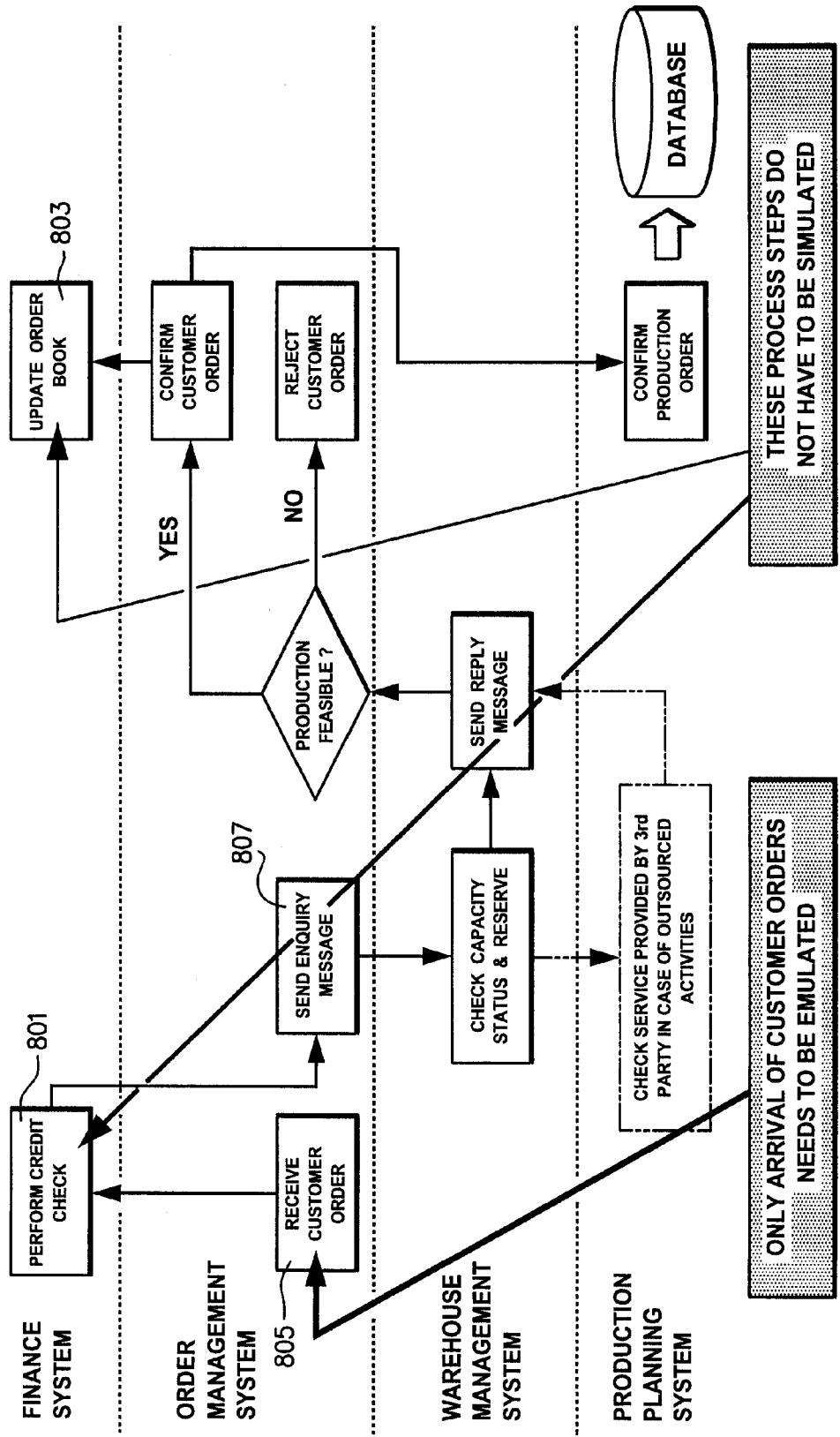
FIGS. 8 and 9 illustrate "customer order processing" and "production execution", respectively.
Figure 9:
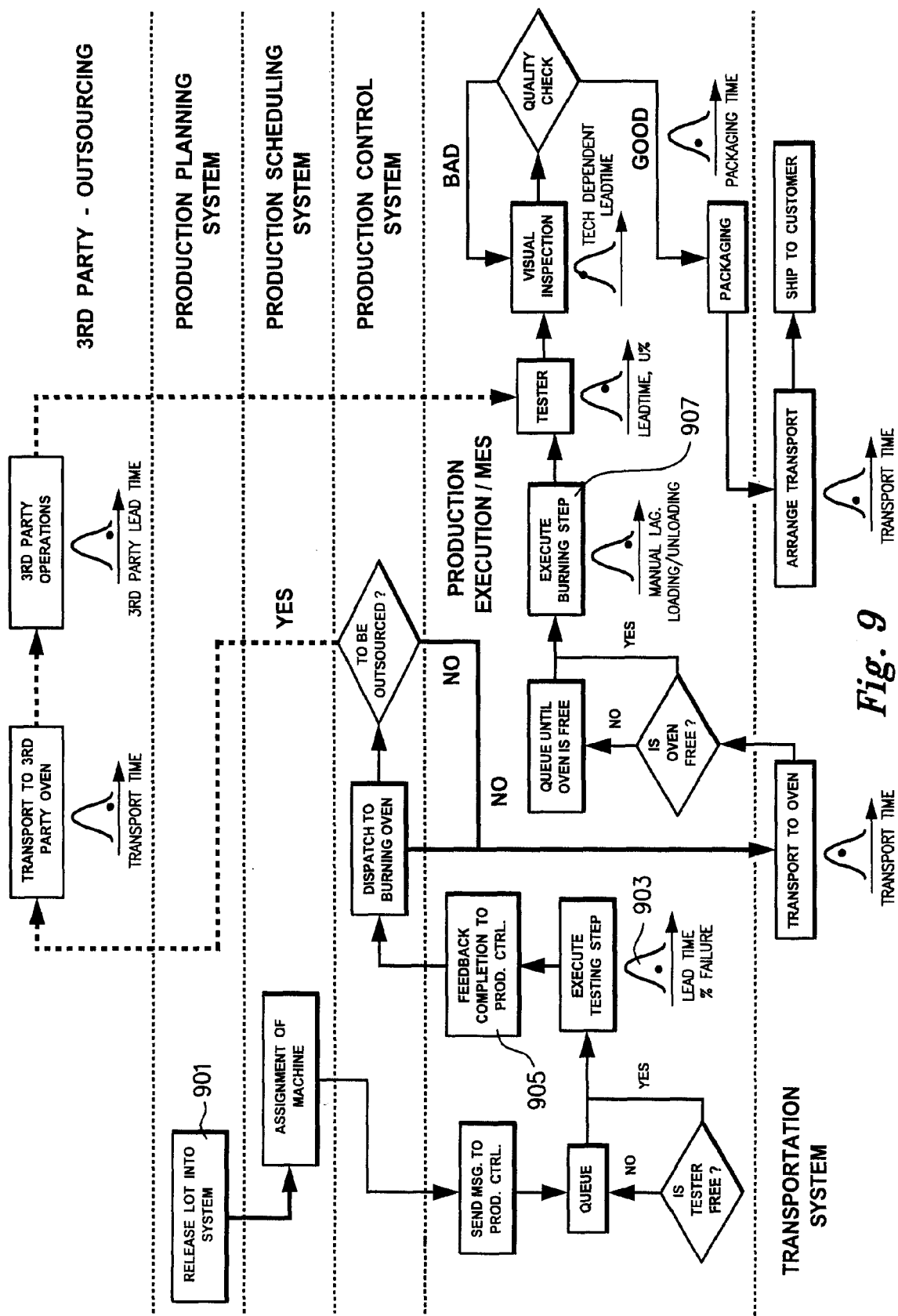

FIGS. 8 and 9 illustrate "customer order processing" and "production execution", respectively. These processes are related to operational execution and therefore have to be included in the operational execution simulation. Customer order processing is very critical in an environment where the available-to-promise procedure stretches across several IT systems. The process for re-generation of an execution plan/schedule is another example process related to operational execution (the "production planning system" of FIG. 8 generates this plan/schedule).

The software application 209 is used to represent the systems in FIG. 8 and the systems performing automated operations in FIG. 9. These systems performing automated operations (executed by a software system) are the ones without the accompanying distribution curves in FIG. 9.

The simulation model 309 simulates all the steps with the distribution curves (for example the "lead time" distribution curve 903) in FIG. 9. All the steps with the distribution curves are executed by humans and production machines. The distribution curves can represent a lead-time distribution, thus emphasizing that the activity involved has some stochastic behavior. The simulation model can be one comprehensive model or may be a collection of smaller models representing individual production workstations, decision making points, and machines.

Process steps that are irrelevant for operational performance (such as "perform credit check" 801 or "update order book" 803 (see FIG. 8) can be skipped. Other supporting business processes such as monetary transactions, execution of equipment maintenance, and customer inquiries that do not lead to orders, do not have to be included into the simulation at all.

Assuming that it is fully automated, the entire customer order process as shown in FIG. 8 is simulated and executed on the framework-based software application 407. On the other hand, anything that is not included in the application is emulated, such as arrival of incoming customer orders 805, release of material (lot) into production systems 901 (FIG. 9—push environment), start of production order execution (pull environment), execution of a production step (for example an execute burn in step 907 (FIG. 9) and timely feedback to production control system 905 (FIG. 9).

Following are some examples of changes of the business processes that can be simulated, assessed and implemented with this technology. FIG. 8 shows a step "send enquiry message" 807 wherein the Order Management System sends an enquiry message to Check capacity, status and reserve. This step can be changed to "inventory changes are reported to order management", for example. Also, the system can change the elements and/or the sequence of queries in the available-to-promise process, change the dispatching rules in the production scheduling/control, temporarily change the resource structure, or outsource parts of the value-added process.

In order to use the business model in the overall simulation, the software application 209 is made DES-compliant (the DES-compliant software application 407). A discrete event simulation comprises a number of events occurring over instances of time in an orderly fashion. Each event takes place at a particular simulation time. To make the application DES-compliant, the application and its internal components are synchronized with the external models. The software application is originally created to run in real time based on inputs it gets. In making the software application DES compliant, the messages from the external models arrive in time sequence but the processing is done faster. For example, the application receives an order at day 0 (simulation time) and then in 1 sec (real-time) it receives an order at day 1. The business application just processes the orders in sequence (of course any activities that need to be performed between the two orders are performed accordingly). So the order on day 0 can immediately be followed by the order on day 1. The processing (CPU time the application takes to process the information) of the order still takes the same time as in the original application.

Figure 10:
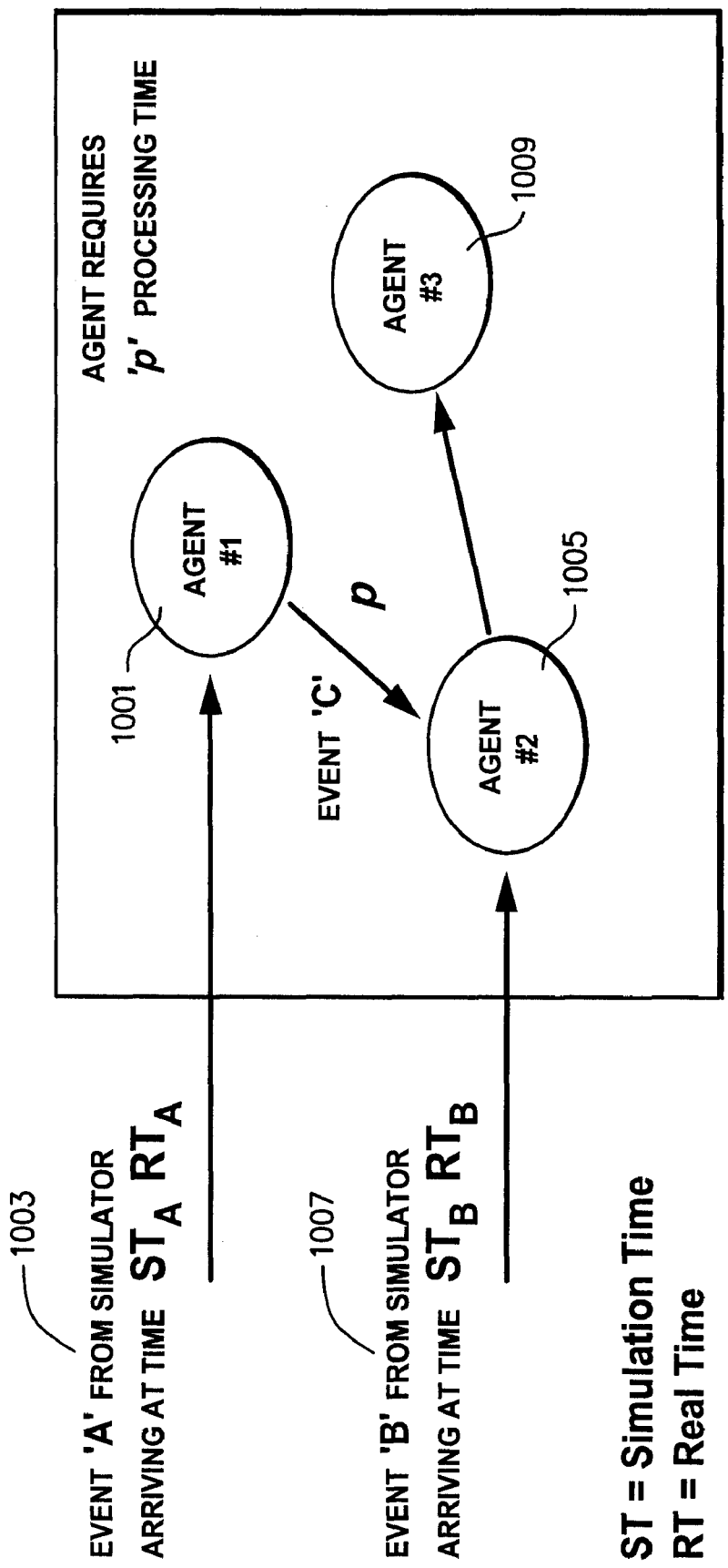
FIG. 10 provides an example explaining the synchronization problem solved by the present invention.

FIG. 10 provides an example explaining the synchronization problem solved by the present invention. Agent 1 1001 receives event A at real time RTA and simulation time STA 1003. Agent 2 1005 receives event B at real time RTB and simulation time STB 1007. Agent 1 1001 processes event A to generate event C 1009. The processing of event A takes p seconds (real-time). Event C has to be processed by Agent 2 before event B at simulation time STC. In this case, since the application advances in real-time, Agent 2 may end up processing event B before event C. Equations 1 and 2 illustrate this situation. Event C has to be processed before event B but the time it takes to be generated (RTA+p) is past the time event B is generated and sent to Agent 2.

$$RTA+p>RTB \quad \text{(Eq. 1)}$$

$$STC<STB \quad \text{(Eq. 2)}$$

Further complications can arise due to latency caused by network traffic, where a message from an agent's past arrives in the future. This causes a paradox and thus the discrete event simulation may no longer be emulating the truth (Here, emulation can be defined as using a simulation to imitate a real system for testing/development of a real-time system, while simulation can be defined as representing the physical processes in a simulation model to perform studies on a future/present real system without actual execution on the real system). Thus a mechanism is needed to ensure that it is safe to advance the time of an entity to the next designated value. A mechanism for synchronization of simulation time with real time solves these problems.

A two-level solution solves the synchronization problems mentioned above and contributes to achieving the objectives of this invention. The two levels are as follows:
1. Introduce a mechanism of synchronization for the software applications 209 (or 301 and 303) so that they advance in time using state changes or using message-based communication.
2. Introduce a communication interface between the software application 209 and the HLA network by using adapters provided by the software application and also by using direct interaction with the agents.

Certain prerequisite steps are required in order to implement the synchronization mechanism. Events in an software application 209 may represent the changing of states of certain objects or the arrival of certain messages. The synchronization mechanism in both, although similar in nature, has a few differences. In using this approach, it is helpful if all the process maps are available and if additions/modifications to the software application 209 are permitted. These process maps can be the process map of the business, for example the business model. These process maps are also helpful in creating the original real-time software applications 209, 301, 303. This model shows in detail how orders come in, how they move in the system, etc. The "Customer Order Processing" of FIG. 8 is an example of such a process map. Irrespective of the type of application, there are two steps which are performed as a pre-requisite in the present invention.

One prerequisite step is the discretization of the processes. The process maps are broken down into discrete sub-processes. The smallest sub-process is then represented by one operation over an object. Here, for example, an object can be an order placed by a customer and operation capacity check performed as a result of the order.

Another prerequisite step is the development of the application federate. The application federate performs two functions. The first is to interact with the other federates and represent the computer application 303. In other words, the application federate (see FIG. 3, reference numbers 305, 307 for an example of the application federate in the system) is a proxy for the application in the distributed simulation of the entire organization. The second function is to control the various operations inside the computer application 209 and synchronize it with the rest of the federation. This is performed in either of two different ways depending upon the nature of the software application 209 i.e. state-based or message-based. The internal working of the software application 209 can be state-based or message-based. Here, a state based application is one that advances depending upon the states of different objects. Each agent watches the state of some objects and a change in their state triggers off the agent to perform an action. In the case of message based applications, the agents send messages once a task is done, and then initiate tasks once they receive a message.

In applications that advance in time through state changes, the state changes trigger agents to operate on various objects in a manner defined by the business processes which the software application 209 is based on. These operations on objects change their states further triggering off other agents and so on. The important point is the last operation/state change in any sub-process. If left to continue on its own, it would trigger off a new sub-process. Take for example the case in FIG. 11. There are two sub-processes A 1101 and B 1103. Each one of them has some tasks to be performed. The sequence of tasks specifies that an external event E has to occur 1105 before sub-process B 1103 is started. Thus there is a need of synchronization. The agents are represented by the stick figures. The agent 1109 which triggers off B 1103 waits for the change of state of object O 1107. The last operation in sub-process A 1101 is the changing of state of O 1107. Two solutions can be used to address this issue. They depend upon the choice of user and vary in the amount of changes that need to be made in the manner the software applications 301 are generated.

Figure 12A:
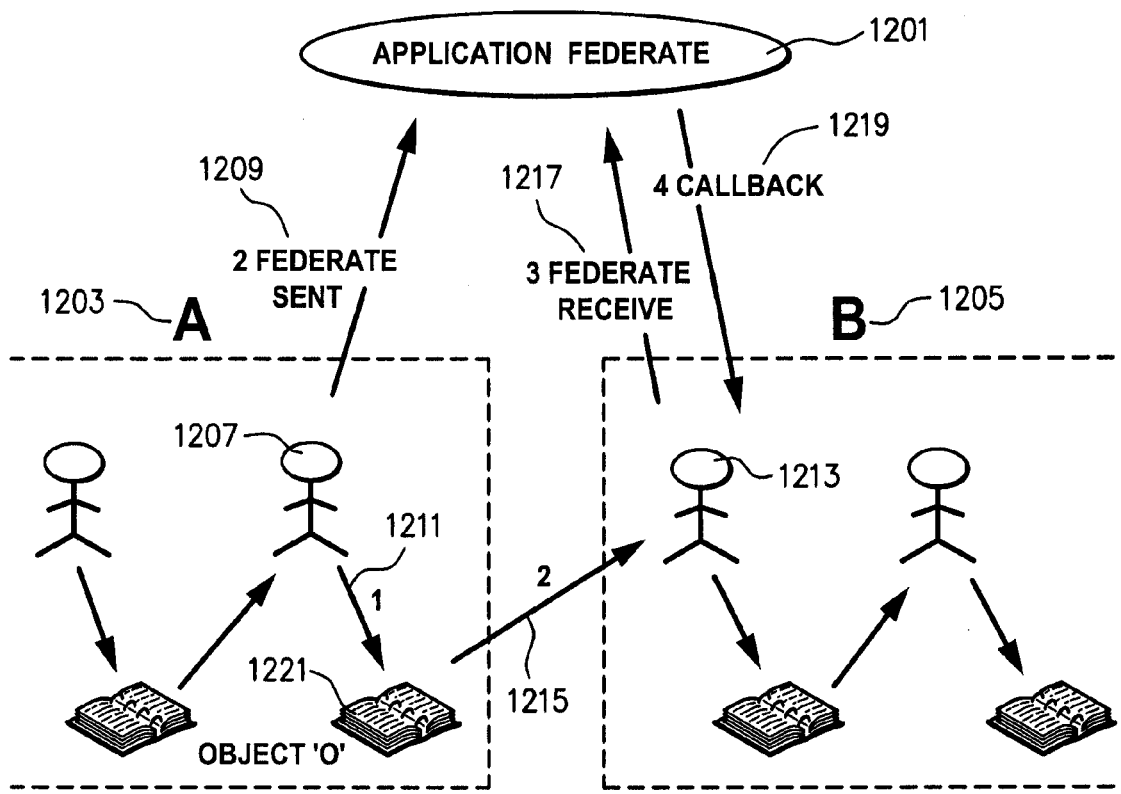
FIG. 12 (a) demonstrates synchronizing applications that advance in time through state changes by having each agent in the application perform two extra functions, federate-sent and federate-receive.
Figure 12B:
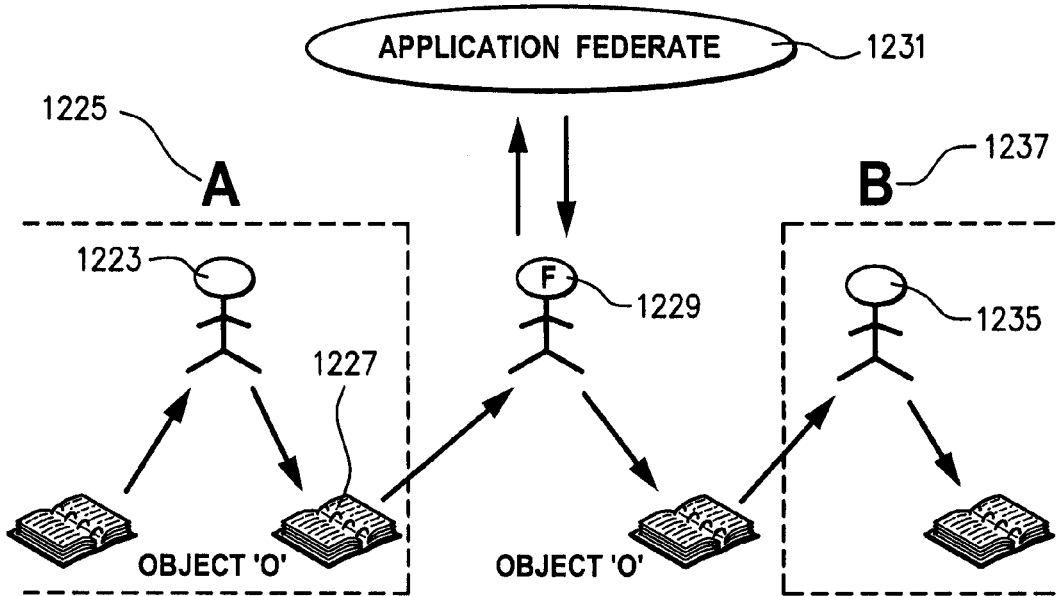

FIG. 12(*a*) shows one synchronization solution for applications that advance in time through state changes. Each agent (again represented by the stick figures in the FIGURE) in the application is capable of performing two extra functions (federate-sent and federate-receive). These functions are triggered depending upon the position of the agent in any sub-process. If the agent is the last in sub-process A (for example, the agent 1207) then it triggers federate-sent 1209 once it completes its designated task 1211. The federate-sent function 1209 informs the application federate 1201 that the particular sub-process 1203 has been completed. In case an agent 1213 is at the start of sub-process B 1205 and the state change occurs that triggers it 1215, then the agent 1213 calls the function federate-receive 1217. This function informs the application federate 1201 that a new sub-process 1205 has to be started. The agent 1213 starts the new sub-process 1205 when it gets a call-back 1219 to this function. In the case where, before a call-back 1219 is received, the state of the same object 1221 changes, the agent 1213 then performs the operation related to the latest change. The agent 1213 triggers off the process B 1205 when the state of the object 1221 changes thus triggering 1215. Note that if the callback 1219 is not yet received by the agent 1213, but another change occurs in the object 1221, then the operation performed by the agent 1213 would correspond to this new change. The agent will not respond to the callback associated with the old change.

FIG. 12(*b*) shows another synchronization solution for applications that advance in time through state changes. The last agent 1223 in sub-process A 1225 changes the state of object O 1227. There is a federate agent 1229 which is designed just like any other agent in the application apart from the fact that it can communicate with the application federate 1231. The federate agent 1229 changes the state of an object O' 1233 (clone of object O) based on the synchronization with externals. Here, externals are the discrete element simulation components of the operational model. This change in state of object O' 1233 triggers the first agent 1235 in the following sub-process B 1237.

Figure 13:
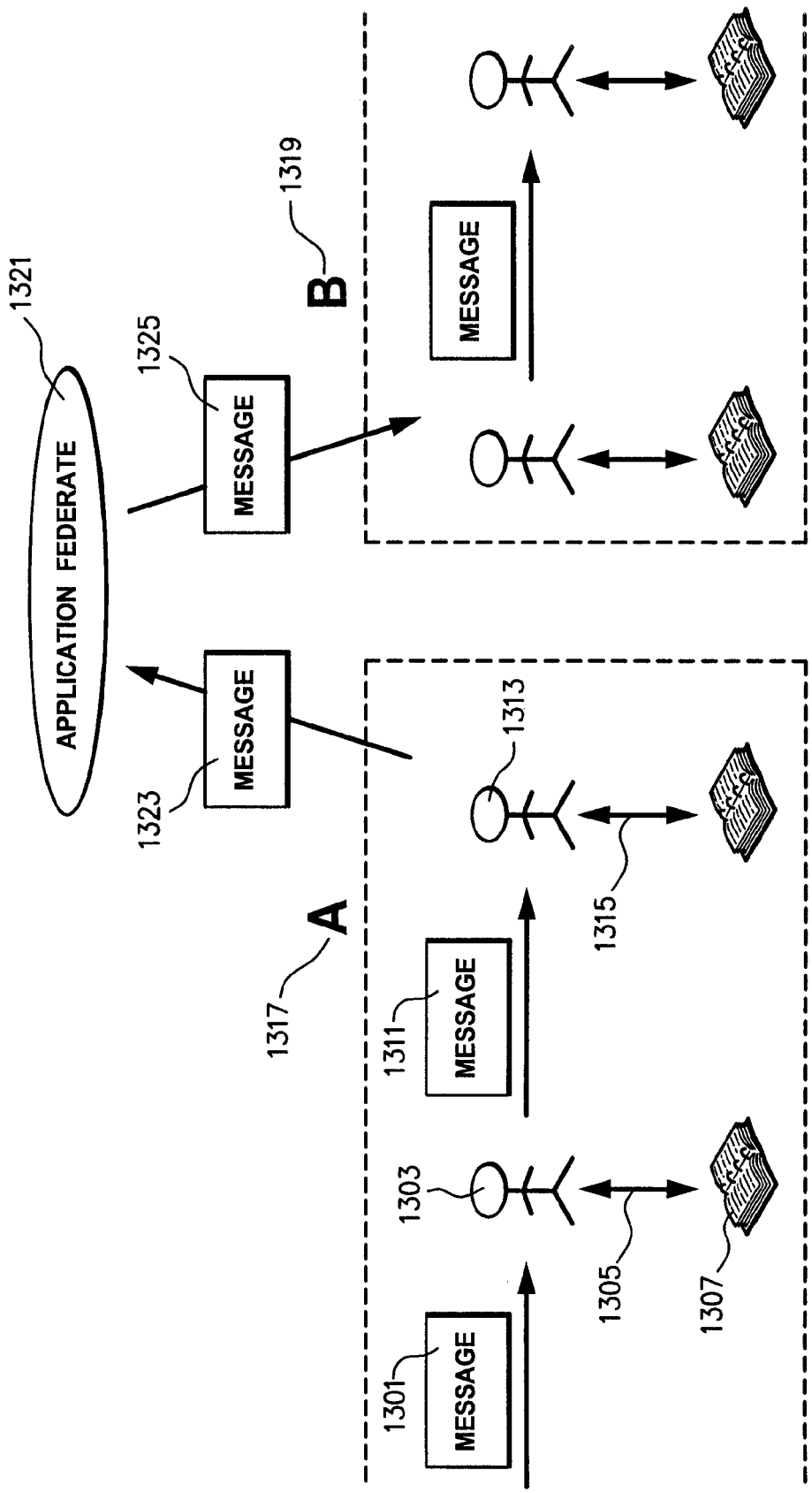
FIG. 13 demonstrates synchronizing applications that advance in time through message-based communication.

FIG. 13 shows a synchronization solution for applications that advance in time through message-based communication. Arrival of a message 1301 triggers an agent 1303 to perform operations 1305 on various objects 1307. The agent can send a message 1311 anytime to another agent 1313 to start off other tasks 1315. This application already has a number of features of DES and requires very less amount of modifications. The destination agent name/id is included in the attributes of a message. All messaging 1323, 1325 between agents belonging to two different sub-processes A 1317 and B 1319 is routed through the application federate 1321. This allows the application federate 1321 to control the flow of information inside the application and synchronize with the other federates.

Figure 14B:
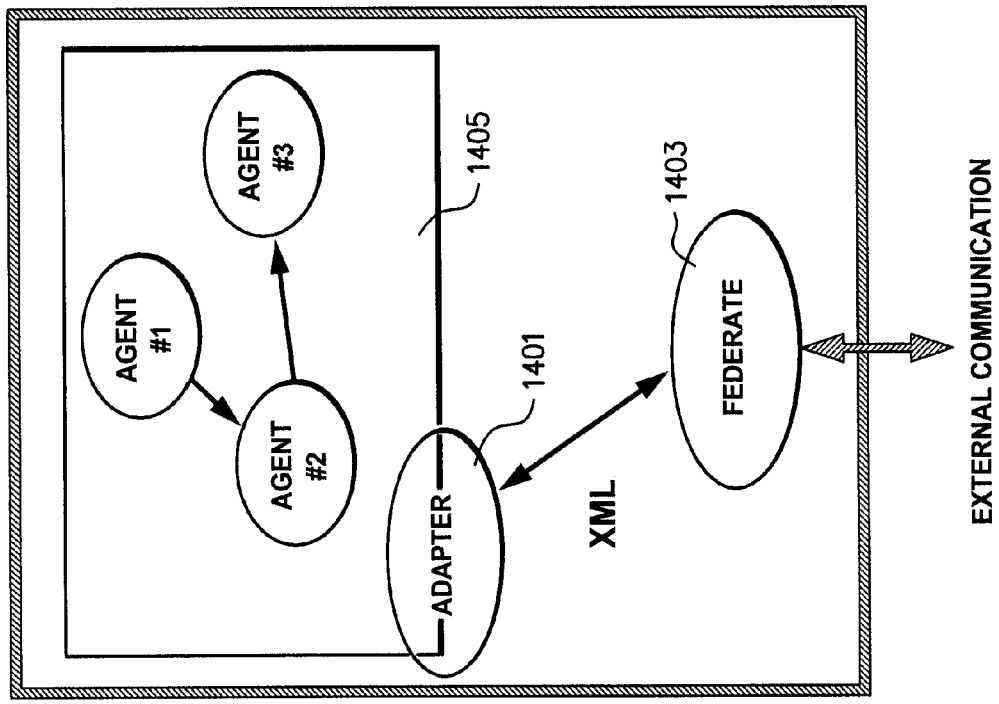
FIGS. 14 (a) and 14 (b) illustrate interfaces between the High-Level Architecture (HLA) using a direct connection with the agents and implemented using an already available adapter, respectively.
Figure 14A:
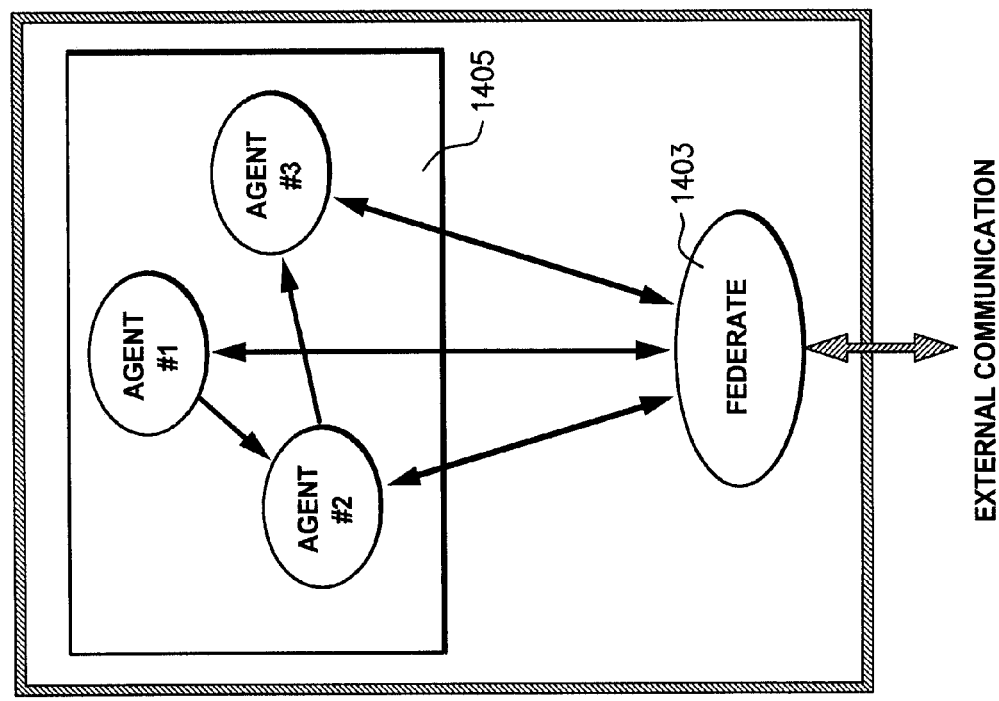

The interfaces between the High-Level Architecture (HLA) and the application can be implemented using an already available adapter 1401 (FIG. 14(*b*)) or a direct connection with the agents (FIG. 14(*a*)). A further layer of a translator can be used such as the communication language used on the application side which can be one of the available XML standards. The HLA includes the federate 1403. The federate 1403 proxies for the software application in the HLA simulation. In the FIGS. 14(*a*) and (*b*), everything within the small boxes 1405 is the DES-compliant software application 401.

The present invention allows integrated and seamless optimization of both business processes and operations of an enterprise. The usage of framework-based business application technology ensures that the changes suggested and tested in the simulation are seamlessly implemented in the real life system. It allows the industrial user to trace transitions from one business execution model to another and to analyze the effect of each small change on the operations.

Although specific examples have been given above, there are three general conditions to be considered in making the software application DES-compliant.

Figure 11:
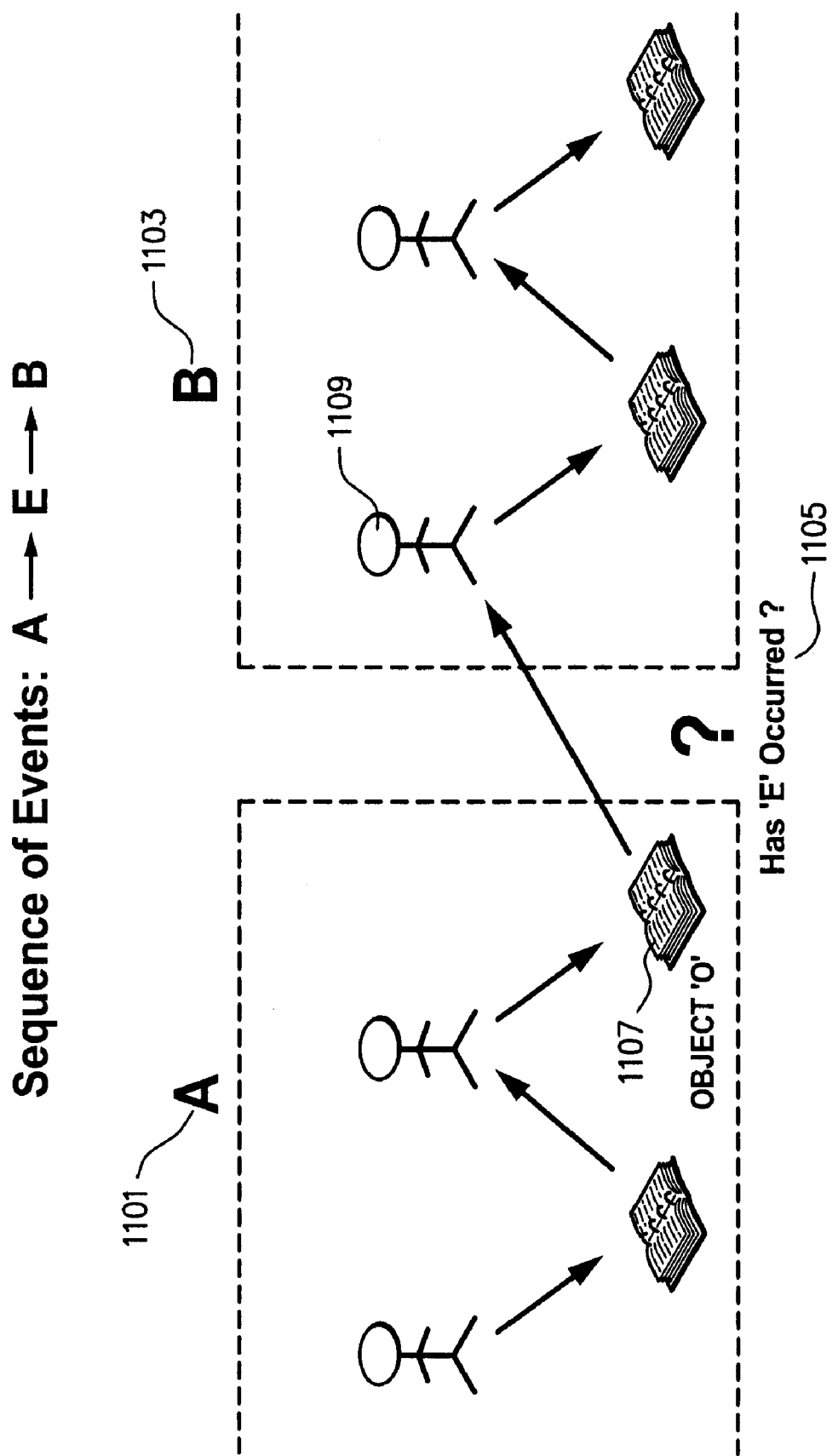
FIG. 11 shows an application that advances in time through state-changes.

The application should be made of modules and components which are linked to each other to represent a process (similar to FIG. 11). The software components may be software agents and also encompass other ways of achieving such functionalities.

The triggering of subsequent steps in any process should be able to be paused indefinitely through some control mechanism outside the application. This is done so as not to interfere with the processing of any other orders, documents, instructions, etc. in the application. In other words, the step between components can be controlled externally.

Also, the process flow should be exposed outside the application. For example, the process flow can be available as a separate document.

Thus, although the invention has been described above using particular embodiments, many variations are possible within the scope of the claims, as will be clear to a skilled reader.

We claim:

1. A computer system for enhancing the performance of underlying policies and execution-rules of real-world activities, comprising:
   a demand input section configured to provide demand information to drive the system;
   a real-time software application configured to process a series of discrete steps in real-time and being configured to implement the underlying policies and execution-rules of the real-world activities and to convert the demand information into instructions;
   an operations-simulation model configured to emulate the real-time software application and to implement the underlying policies and execution-rules of the activities in simulation time and which receives the instructions;
   a control section configured to integrate the real-time software application with the operations-simulation model to produce a unified output in simulation time, the control section comprising a synchronization clock configured to synchronize the real-time discrete steps of the real-time software application with the simulation time of the operations-simulation model by advancing to the execution of selected discrete steps emulate, by the operations-simulation model, the implementation by the real-time software application of the underlying policies and execution-rules of the real-world activities in the simulation time by delaying the execution of the selected discrete steps in the simulation time, and to communicate the instructions from the real-time software application to the operations-simulation model; and
   an output section configured to output the unified output, wherein said simulation time is faster than the processing time of the real-time software application.

2. The computer system of claim 1, wherein the software application comprises reconfigurable modules for reconfiguring based upon the underlying policies and execution-rules of the activities determined from the output section.

3. The computer system of claim 1, further comprising additional software applications and additional simulation-time operations-simulation models synchronized together through the control section.

4. The computer system of claim 1, wherein the control section utilizes the High Level Architecture enabling communications between a planning model and the operations simulation by synchronizing the real-time software application with the simulation-time operations simulation model.

5. The computer system of claim 1, wherein the software application is a business application used in the running of a business.

6. The computer system of claim 1, wherein the operations simulation simulates physical operations.

7. The computer system of claim 1, wherein the demand information is based on emulated customer demand.

8. The computer system of claim 1, wherein at least some of the real-world activities are performed by a production or service facility and the demand information represents demand for a product processed by the production or service facility.

9. The computer system of claim 1, wherein at least some of the real-world activities are performed by a production facility and the demand information represents demand for a service produced by the production facility.

10. The computer system of claim 1, wherein the software application includes software agents executing operations over software object representations.

11. The computer system of claim 10, wherein the software object representations include forms used in the running a production facility.

12. A method for enhancing the performance of underlying policies and execution-rules of real-world activities, comprising:
inputting demand information into a real-time software application for processing a series of discrete steps in real-time;
translating the demand information into instructions and passing the instructions to an operations-simulation model via a control section, the operations-simulation model being configured to emulate the real-time software application and to implement the underlying policies and execution-rules of the real-world activities in simulation time;
producing a unified output in simulation time by integrating the real-time software application and the operations-simulation model by synchronizing the real-time discrete steps of the real-time software application with the simulation time of the operations-simulation model via the control section configured to advance to the execution of selected discrete steps of the real-time software application emulate, by the operations-simulation model, the implementation by the real-time software application of the underlying policies and execution-rules of the real-world activities in the simulation time by delaying the execution of the selected discrete steps in the simulation time, and communicate the instructions from the real-time software application to the operations-simulation model; and
outputting the unified output; and
executing the real-world activities utilizing the unified output,
wherein said simulation time is faster than the processing time of the real-time software application.

13. The method of claim 12, further comprising the step of changing elements of the operations-simulation model in addition to changing elements of the real-time software application to create a modified operations-simulation model and again performing the steps of inputting demand information, translating the demand information, passing the translated demand, synchronizing the real-time software application, and outputting from the modified operations-simulation model, and executing the real-world activities utilizing operations modified according to the modified operations-simulation model.

14. The method of claim 12, wherein the translated demand is input-release information.

15. The method of claim 12, wherein the control section utilizes the High Level Architecture.

16. The method of claim 12, wherein the elements of the software application are changed by changing a metamodel in a framework-based application.

17. Computer System for enhancing the performance of underlying policies and execution-rules of real-world activities, comprising:
an input section for inputting demand information into a real-time software application for processing a series of discrete steps in real-time;
a translator for translating the demand information and passing the translated demand information to an operations-simulation model via a control section, the operations-simulation model being configured to emulate the real-time software application and to implement the underlying policies and execution-rules of the real-world activities in simulation time;
a control section configured to integrate the real-time software application with the operations-simulation model to produce a unified output in simulation time
a synchronizer for synchronizing the real-time discrete steps of the real-time software application with the simulation time of the operations-simulation model utilizing the control section by advancing to the execution of selected discrete steps of the software application and communicating the translated demand information to emulate, by the operations-simulation model, the implementation by the real-time software application of the underlying policies and execution-rules of the real-world activities in the simulation time by delaying the execution of the selected discrete steps in the simulation time;
an output section configured to output the unified output;
configuration modules for changing elements of the real-time software application to create a modified software application based on the unified output and again arranged to input demand information, translate the demand information, pass the translated demand information, synchronize the software application, and output from the operations-simulation model; and
an executor for executing the real-world activities utilizing the modified software application,
wherein said simulation time is faster than the processing time of the real-time software application.

18. The Computer System of claim 17, wherein the translated demand is input-release information.

19. The Computer System of claim 17, wherein the control section utilizes the High Level Architecture.

20. The Computer System of claim 17, wherein the elements of the software application are changed by changing a metamodel in a framework-based application.

21. The computer system of claim 1, wherein the synchronization between the real-time software application and the operations-simulation model is performed by message-based communication, in which the advancing is performed upon receiving a message.

22. The computer system of claim 1, wherein the control section is configured to generate a new DES compatible software application based on the unified output and to discard the real-time software application.

* * * * *